(12) United States Patent
Lee et al.

(10) Patent No.: US 9,915,695 B2
(45) Date of Patent: Mar. 13, 2018

(54) DETECTING A PROPER CONNECTION

(71) Applicant: Toshiba Global Commerce Solutions Holdings Corporation, Tokyo (JP)

(72) Inventors: Yi-Sheng Lee, Taipei (TW); Wei-Yi Hsuan, Taipei (TW); Chia-Lin Yang, Taipei (TW); Te-Chia Tsai, Taipei (TW)

(73) Assignee: Toshiba Global Commerce Solutions Holdings Corporation, Tokyo (JP)

( * ) Notice: Subject to any disclaimer, the term of this patent is extended or adjusted under 35 U.S.C. 154(b) by 568 days.

(21) Appl. No.: 14/557,018

(22) Filed: Dec. 1, 2014

(65) Prior Publication Data

US 2016/0154048 A1   Jun. 2, 2016

(51) Int. Cl.
*G01R 31/04* (2006.01)
*H01R 13/66* (2006.01)
*H01R 24/64* (2011.01)
*H01R 29/00* (2006.01)

(52) U.S. Cl.
CPC ......... *G01R 31/04* (2013.01); *H01R 13/6683* (2013.01); *H01R 24/64* (2013.01); *H01R 29/00* (2013.01)

(58) Field of Classification Search
CPC .... G01R 31/04; H01R 13/6683; H01R 24/64; H01R 29/00
USPC ...................................... 340/686.1
See application file for complete search history.

(56) References Cited

U.S. PATENT DOCUMENTS

| | | | |
|---|---|---|---|
| 5,062,806 A | 11/1991 | Ohno et al. | |
| 5,066,919 A | 11/1991 | Klassen et al. | |
| 5,570,029 A | 10/1996 | Bottman et al. | |
| 5,946,180 A | 8/1999 | Simpson | |
| 7,633,733 B1 | 12/2009 | El-Sayed | |

(Continued)

FOREIGN PATENT DOCUMENTS

| | | |
|---|---|---|
| CN | 201629768 U | 11/2010 |
| GB | 2180657 A | 4/1987 |

OTHER PUBLICATIONS

Kihara, Mitsuru, et al., Tool for inspecting faults from incorrectly cleaved fiber ends and contaminated optical fiber connector end surfaces, Optical Fiber Technology, 2012, pp. 470-479, Elsevier Inc., Amsterdam, Netherlands.

(Continued)

*Primary Examiner* — Nader Bolourchi
(74) *Attorney, Agent, or Firm* — Patterson + Sheridan, LLP (57) ABSTRACT

Examples provided herein describe a female connector in a computing device that includes a plurality of sensors for determining if a male connector has established a proper connection with the female connector. To do so, in one example, each of the sensors is coupled to an actuator that protrudes into an aperture defined by an inner surface of the female connector. As the male connector is inserted into this aperture, the actuators are pressed down which activates the sensors. Furthermore, the actuators are arranged such that a first actuator is deeper within the aperture than a second actuator. Thus, if the male connector pressed down the first actuator but not the second, a computing device can determine that only a partially connection was made. By using at least two actuators arranged at different depths in the aperture, the computing device is able to detect a proper or improper connection.

20 Claims, 7 Drawing Sheets

(56) References Cited

U.S. PATENT DOCUMENTS

| | | | |
|---|---|---|---|
| 8,295,185 B2 | 10/2012 | Binder | |
| 2003/0113118 A1 | 6/2003 | Bartur | |
| 2004/0154831 A1* | 8/2004 | Seydoux | E21B 7/04 |
| | | | 175/24 |
| 2009/0284875 A1* | 11/2009 | Ford | H01R 13/6683 |
| | | | 361/13 |
| 2014/0013012 A1 | 1/2014 | Terlizzi et al. | |
| 2015/0064958 A1* | 3/2015 | Katayanagi | H01R 29/00 |
| | | | 439/366 |

OTHER PUBLICATIONS

Kakamanshadi, Gholamreza, et al., Role of Hardware Test for Establishing Reliable Path in Computer Networks, 2nd International Conference on Networking and Information Technology, 2011, pp. 299-305, vol. 17, IACSIT Press, Singapore, Singspore.

* cited by examiner

DETECTING A PROPER CONNECTION

BACKGROUND

The present invention relates to detecting proper connection between male and female connectors, and more specifically, to using a plurality of sensors in the female connector to determine if the connection is proper.

Many wired data communication techniques mate a male connector with a female connector in order to establish data communication between a computing device and an external device or network (e.g., a LAN or WAN). To do so, the male or female connectors may include a latching mechanism that secures the male connector to the female connector once the connection is fully engaged. However, the user may not fully engage the latching mechanism, in which case, the female and male connectors do not establish data communication, or the latching mechanism may have failed which permits the male connector to move and not maintain the fully engaged connection. Alternatively, the user may have forgotten to plug in the male connector. In either case, the computing system cannot determine if the user has failed to make a proper connection, or whether the user has made a proper connection but the external device or network (e.g., a LAN) is unavailable. For example, the computing device may rely on the female and male connectors to establish data communication with a network device (e.g., switch or router). However, if the computing device cannot send data to or receive data from the network device, the computing device has no means for determining if the male/female connection is improper or if the network device is unavailable.

SUMMARY

One embodiment of the present disclosure is a female connector that includes an inner surface defining an aperture and an opening at a first end of the aperture where the opening is configured to receive a male connector. The female connector includes at least one data connector element arranged on the inner surface to contact a respective data connector element on the male connector. The female connectors also includes a first detector disposed on the inner surface and is spaced a first distance from the opening along a first direction. Furthermore, a characteristic of the first detector is changed when the male connector is proximate to the first detector. The female connector includes a second detector disposed at the inner surface and is spaced a second distance from the opening along the first direction where the second distance is greater than the first distance. Furthermore, a characteristic of the second detector is changed when the male connector is proximate to the second detector.

Other embodiments of the present disclosure include a method and a computer program product for checking a connection between a female and male connector. The method and computer program product include determining whether a first detector is activated by the male connector disposed on a first end of cable, where the first detector is disposed on an inner surface of the female connector and is spaced a first distance from an opening defined by the inner surface for receiving the male connector. The method and computer program product also include determine whether a second detector is activated by the male connector, where the second detector is disposed on the inner surface and is spaced a second distance from the opening and where the second distance is further from the opening than the first distance relative to a direction perpendicular to the opening.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Figure 1A:
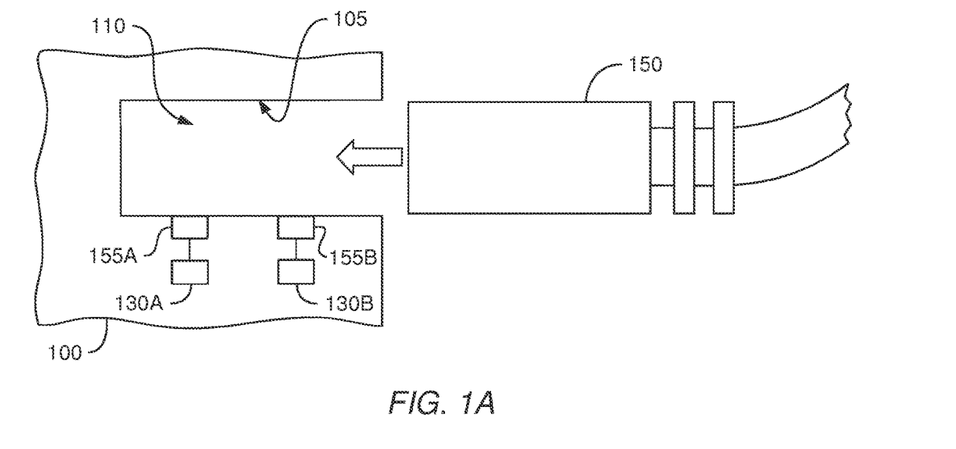
FIGS. 1A and 1B are side views of a female connector with a plurality of sensors, according to one embodiment described herein.

Examples provided herein describe a female connector in a computing device that includes a plurality of sensors for determining if a male connector has established a proper connection with the female connector. As used herein, a "proper connection" is a connection between the male and female connectors where data (including voice or video) or power signals can be transmitted between the connectors. FIG. 1A shows a side view of a connector system including a female connector 100 and a male connector 150. To determine if a connection is proper, the female connector includes two detection elements 155 (e.g., detectors) located at different depths of an aperture 110 defined by an inner surface 105 of the female connector 100. The aperture 110 is sized and shaped to accommodate the male connector 150. As the male connector 150 is inserted into the aperture 110, the sensors 130 are tripped. It is contemplated that the sensors 130 may be tripped using the detection elements 155 in any variety of manners including by mechanical, electrical, optical, and/or magnetic means. As the male connector 150 moves closer to the detection elements 115, the connector 150 changes a characteristic of the detection elements 155 by, for example, contacting the element 115, blocking light emitted by the detection element 155, changing magnetic flux associated with the element 155, establishing an electrical connection and the like. As used herein, the characteristic of the detection element 155 is changed when the male connector 150 is moved proximate to the detection element 155.

In one aspect, the detection elements 155 are provided such that a first detection element 155B is associated with an aperture depth closer to an opening of the aperture 110 than a second detection element 155A, such that the sensors 130 are tripped progressively with the increasing depth of the male connector 150 in the aperture 110. Thus, if the male connector 150 trips the sensor 130B but not sensor 130A, the computing device can inform the user to push the male connector 150 further into the aperture. However, if the male connector 150 trips both of the sensors 130, the sensors 130 inform the computing device that a proper connection was made. Thus, by using a plurality of sensors 130 (two or more) and detection elements 155 associated with different depths in the aperture 110, the computing device is able to detect a partial connection, a proper connection, or if there is no connection.

Figure 1B:
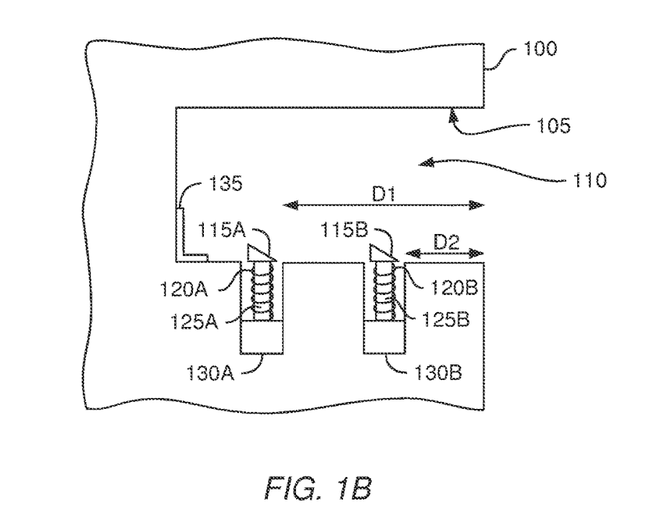

FIG. 1B is a side view of the female connector 100 with a plurality of sensors 130, according to one embodiment described herein. The female connector 100 includes an inner surface 105 that defines an aperture 110. Inner surface 105 and aperture 110 may be used to receive a corresponding male connector. That is, the shape of the inner surface 105 may substantially match at least a portion of an outer surface of the male connector. In one aspect, the outer surface of the male connector contains key features that correspond with the inner surface 105 to ensure the female connector 100 and male connector are aligned. Moreover, a latching mechanism may be used (either on the female connector 100 or the male connector) that holds the connectors securely in place once the connectors are properly connected.

The female connector 100 includes actuators 115, sensors 130, and data connectors 135. As shown, two sensors 130A and 130B are shown recessed into the body of the female connector 100 and each sensor 130 includes a respective actuator—actuators 115A and 115B. These actuators 115 are coupled to respective rods 125 that are slidably disposed within axial openings formed by spiral springs 120. The springs 120 are bounded at one end by a lower surface of the respective actuators 115 and at another end by upper surfaces of the respective sensors 130. The springs 120 generate a force that urges the actuators 115 away from the sensors 130 such that a top surface of the actuators 115 extends into the aperture 110 (referred to herein as the "uncompressed state"). The distance the actuators 115 extend into the aperture 110 (and the separation distance between the actuators 115 and sensors 130) may be established by stopping members located on a portion of the rods 125 contained within the sensors 130. For example, as the springs 120 force the actuators 115 away from the sensors 130, the stopping member prevent the rods 125 from extending further, thereby establishing the uncompressed state (or default state).

When the male connector is slid into the aperture 110, a bottom surface of the male connector contacts the actuators 115 and counters the force being applied by the spring 120 (assuming the male connector fits snugly within the aperture 110 of the female connector 100). The male connector reduces the separation distance between the actuators 115 and the sensors 130 by compressing the spring 120 (referred to herein as the "compressed state"). Moreover, male connector forces the rods 125 into the sensors 130. This mechanical motion may change a state of the sensors 130. For example, the uncompressed state results in the sensors 130 being in an "off" state, while the compressed state results in the sensors 130 being in an "on" state. In the off state, the sensors 130 may transmit an electrical signal with a first voltage (or no signal at all), while in the on state the sensors 130 transmit an electrical with a second, different voltage. Based on receiving these electrical signal, a computing device can determine if the actuators 115 are in the uncompressed state or the compressed state—i.e., whether the male connector is contacting the actuators 115.

As shown, the actuators 115 are spaced different distances (D1 and D2) from an opening of the aperture 110. Specifically, the opening is the end of the aperture 110 where the male connector is first inserted and forms a plane extending vertically. Actuator 115A is spaced a first distance D1 from this opening, while actuator 115B is spaced a second distance D2 from the opening where distance D1 is greater than distance D2. That is, the actuators 115 are located at different depths within the aperture 110. Doing so provides more granular information regarding the placement of the male connector in the female connector 100. For example, if the connector 100 included only one actuator 115 or the actuators 115 were located at the same distance relative to the opening (e.g., distance D1), if the actuator(s) are in the uncompressed state than the computing device cannot determine if the male connector is partly in the aperture 110 (e.g., is only half way in the aperture 110) or not in the aperture 110 at all. In the case of the former, the user may believe the male connector is fully engaged with the female connector 100 (i.e., the male connector contacts the data connectors 135) when in reality the male connector is only partly within the aperture 110. By knowing this information, the computing device can provide more detailed instructions. For example, if actuator 115B is in the compressed state but actuator 115A is in the uncompressed state, the computing device may inform the user that the male connector is only partly engaged and instruct the user to push in the male connector. In contrast, if both actuators 115 are in the uncompressed state, the computing device informs the user the male connector is missing and should be connected into the female connector 100.

In one aspect, the outermost actuator 115B (i.e., the actuator closest to the opening) is arranged near the opening to detect when the male connector is first inserted into the aperture 110. Thus, the state of sensor 130B informs the computing device whether the user has attempted (or is attempting) to insert the male connector into the female connector 100. The innermost actuator 115A (i.e., the actuator furthest from the opening) may be arranged near the data connectors 135 to detect when the male connector is fully engaged with the female connector 100 such that data connectors on the male connector contact the data connectors 135. Thus, when actuator 130A is in the compressed state, the computing device is informed, via sensor 130A, that the male connector is fully engaged with the female connector 100. Moreover, if actuator 130A is in the compressed state but if the computing device determines that data is not flowing between the male and female connectors, the device is able to eliminate the physical connection between the male and female connectors as the source of the problem. For instance, the problem may be that a second end of a cable (i.e., the end of the cable that that is opposite the male connector) may not be properly connected, or that a network (e.g., LAN or WAN) may be down.

While FIG. 1B illustrates two actuators 115, in other examples, multiple actuators may be used that are spaced at different distances from the opening of the aperture 110 or at the distances D1 and D2. For example, the female connector 100 may include multiple apertures 115 at the same distance from the opening for increased redundancy or to increase the likelihood at least one of the actuators is compressed in case the male connector does not fit snugly in the aperture 110. For instance, the female connector 100 may include actuators 115 on the top and bottom sides of the inner surface 105 which are both spaced distance D1 from the opening. Furthermore, the actuators 115 may be located on the same side of the aperture 110 as shown here or be located on different sides. For example, aperture 115A may be on the top side of the inner surface 105 to avoid interfering with the data connection between the male and female connectors.

The side view in FIG. 1B illustrates only one data connector 135, but the female connector 100 may include a plurality of data connectors 135 that mate with respective data connectors on the male connector. Each data connector 135 may be used to transmit and/or receive data signals from the male connector. Moreover, the L-shape data connector 135 shown here is only one example of a suitable data connector 135. The shape of the data connector 135 may vary depending on the type of connectors used to transfer data. Furthermore, the female connector 100 is drawn generally and may be modified to be used with any number of known (or currently unknown) female/male connectors. For example, the female connector 100 may be used in Ethernet connections (e.g., RJ45 connectors), USB connections, FireWire® connections (FireWire is a registered trademark of Apple Inc. in the US and many other jurisdictions), InfiniBand® connections (InfiniBand is a registered trademark of InfiniBand Trade Association in the US and many other jurisdictions), HDMI connections, VGA connections, DVI connections and the like.

Figure 2A:
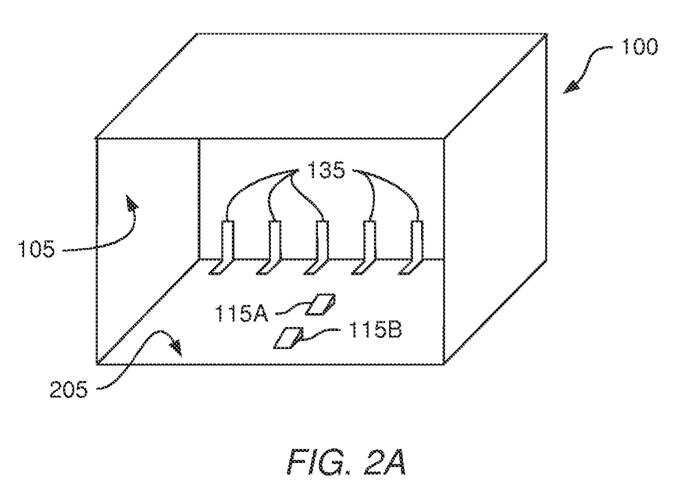
FIGS. 2A and 2B are plan views of female connectors with a plurality of sensors, according to embodiments described herein.
Figure 2B:
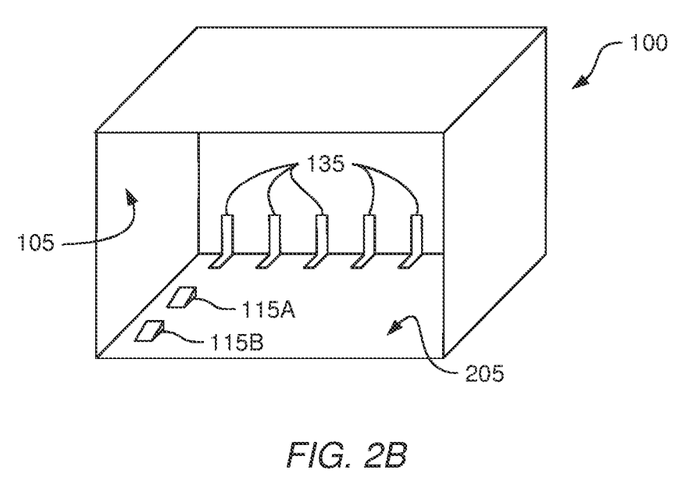

FIGS. 2A and 2B are plan views of female connectors 100 with a plurality of actuators, according to embodiments described herein. For simplicity, FIGS. 2A and 2B illustrate only the inside of the female connectors 100—i.e., the inner surface 105. In FIG. 2A, the actuators 115 are aligned in the middle of a bottom surface 205 of the connector 100. That is, actuator 115A is directly behind actuator 115B relative to a direction that is perpendicular to the opening where the male connector is inserted. Thus, when the male connector is inserted, a bottom surface of the connector first presses down actuator 115B before pressing down actuator 115A. Moreover, the actuators 115 include sloped top surfaces where the front side of the sloped surface that faces the opening is lower (e.g., closer to the bottom surface 205) than the rear side of the sloped surface. The sloped surface may reduce the force required for pressing down the actuators 115 which permits the user to insert the male connector easier than if the actuators 115 were, for example, cubes. In another example, the actuators 115 may be curved (e.g., hemispherical) to mitigate the amount of force needed to insert the male connector into the female connector 100. Moreover, although FIGS. 2A and 2B illustrate two actuators 115, in other embodiments, the connectors 100 may include only one actuator 115 or more than two actuators 115.

Although the actuators 115 are aligned in FIG. 2A, this is not a requirement. For example, the actuators 115 may be offset such that actuator 115A is shifted to the left or right of actuator 115B. Alternatively, instead of being located on the bottom surface 205, actuator 115A may be located on the side or top surfaces of the inner surface 105. Nonetheless, regardless whether the actuators 115 are aligned or misaligned, actuator 115B may be spaced closer to the opening than actuator 115A such that inserting the male connector first presses down actuator 115B before pressing down actuator 115A.

FIG. 2A also illustrates a plurality of data connectors 135. Each data connector 135 may correspond to a respective data connector on the male connector. Moreover, the shape of the inner surface 105 may substantially match key features of the male connector to align the connector such that when the male connector is fully engaged with the female connector 100, the data connectors 135 contact the data connectors on the male connector.

FIG. 2B illustrates arranging the actuators 115 away from the middle of the bottom surface 205. For example, the bottom surface of a male connector for a particular data transfer protocol may be raised at the middle of the connector, and thus, this surface would not press down on the actuators 115 shown in FIG. 2A when inserted into the female connector 100. Thus, in FIG. 2B, the actuators 115 are aligned on the left side of the bottom surface 205 so that the male connector will contact the actuators 115. Alternatively, the actuators 115 may be arranged as shown so that actuator 115A can be moved further back from the opening of the female connector 100 without interfering with the data connectors 135. Thus, FIGS. 2A and 2B illustrate that the particular placement of the actuators 115 on the inner surface 105 may vary depending on any number of factors such as design choice, ease of manufacturability, cost, form factor of male/female connectors, and the like.

Figure 3A:
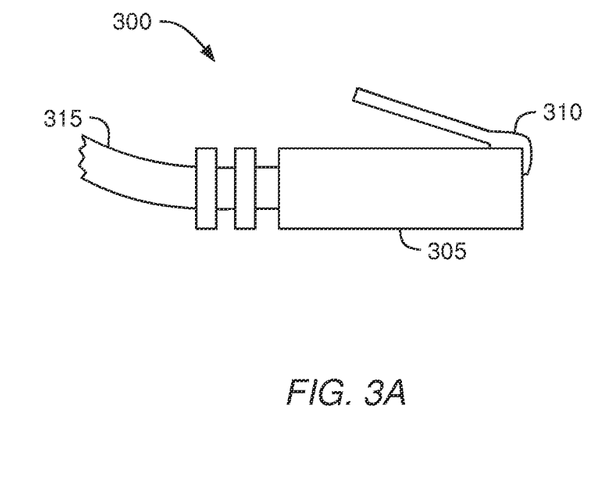
FIGS. 3A and 3B are side and front views of a male connector, according to one embodiment described herein.
Figure 3B:
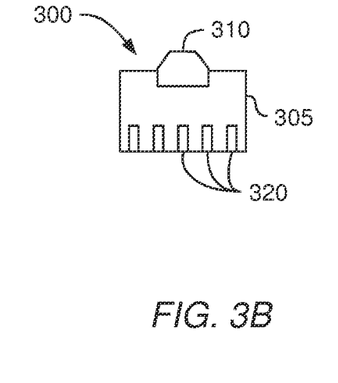

FIGS. 3A and 3B are side and front views of a male connector 300, according to one embodiment described herein. Specifically, the male connector 300 is based on the structure of an RJ-45 connector for Ethernet communications. However, as discussed above, the examples and aspects described herein may apply to many different data transfer protocols such as USB, FireWire, InfiniBand, HDMI, DVI, VGA, and the like.

As shown in FIG. 3A, male connector 300 includes a body 305, latching mechanism 310 and cable 315. The body 305 provides a casing that encapsulates and supports one or more conductive wires that extend from the cable 315 into the body 305. The latching mechanism 310 secures the male connector 300 to the female connector. For example, when the male connector 300 is fully engaged with the female connector, the latching mechanism 310 may couple to a corresponding locking feature in the female connector. By interlocking the locking feature and the latching mechanism 310, the male connector 300 is held securely to the female connector. To remove the male connector 300, the user may first decouple the latching mechanism 310 from the locking feature. For example, the user may press down the latching mechanism 310 which releases the male connector 300 from the female connector. Of course, in other examples, the male connector 300 may not have the latching mechanism 310 in which case the male connector 300 may rely on frictional forces between, e.g., the outer surface of the male connector 300 and the inner surface of the female connector.

The front view shown in FIG. 3B illustrates that the body 305 includes a plurality of data connectors 320 which may be spaced with the same spacing used for the data connectors 135 shown in FIGS. 2A and 2B. As such, when the male connector 300 is inserted into the female connector 100, each of the data connectors 320 pair with a respective one of the data connectors 135.

Figure 4:
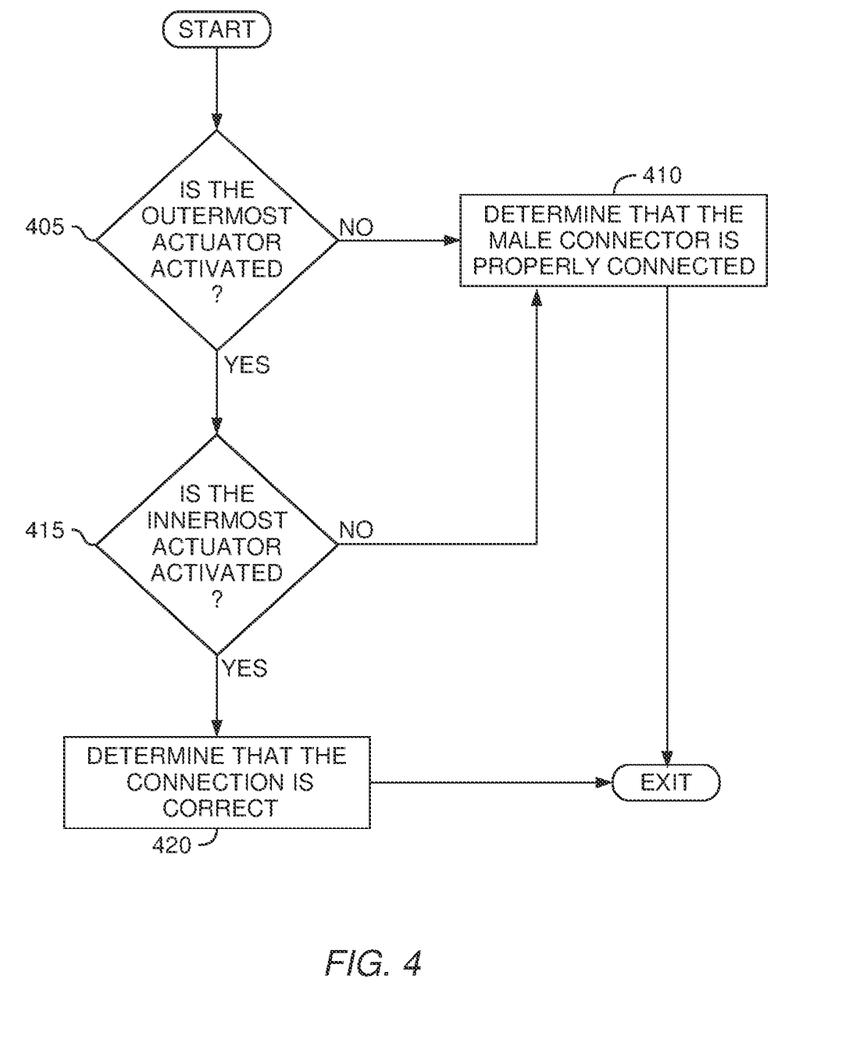
FIG. 4 is a method for detecting proper connection using signals generated by the plurality of sensors, according to one embodiment described herein.

FIG. 4 is a method 400 for detecting proper connection using signals generated by the plurality of sensors, according to one embodiment described herein. For ease of explanation, method 400 is discussed in tandem with FIGS.

Figure 5A:
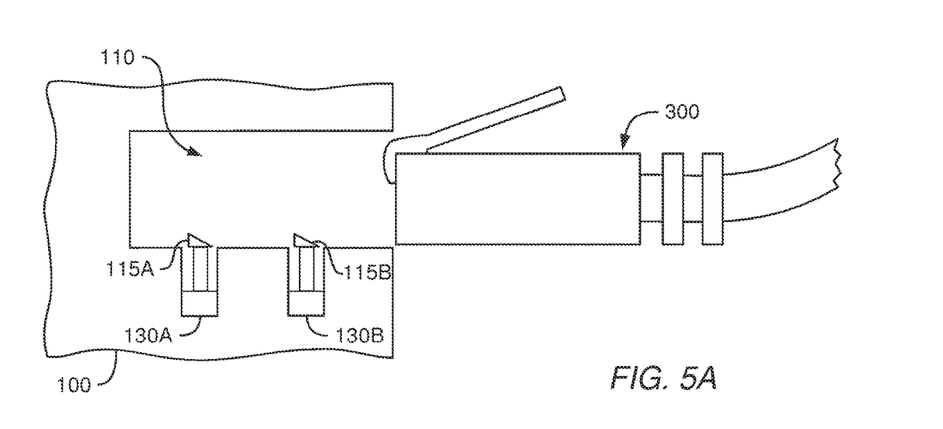
FIGS. 5A-5C illustrate three connection states of the female and male connectors, according to embodiments described herein.

5A-5C which illustrate three connection states of the female and male connectors. Method 400 begins at block 405 by determining whether the outermost actuator is activated (e.g., in the compressed state). As shown in FIG. 5A, the male connector 300 is at or near the opening of the aperture 110 in the female connector 100. Stated differently, the user has just begun to insert male connector 300 into the aperture 110. As such, neither actuator 115B nor actuator 115A are pressed down which means both of these actuators 115 are in the uncompressed state.

Moreover, because actuator 115B is spaced closer to the opening of aperture 110 than actuator 115A, by determining actuator 115B is in the uncompressed state, it can be assumed that actuator 115A is also in the uncompressed state (assuming the male and female connectors fit snugly). As such, at least sensor 130B, which is coupled to actuator 115B, provides an indicator to a computing device to report the state of the actuator 115B. Because the computing device knows that the outer actuator 115B is in the uncompressed state, at block 410, the device determines that the male connector 300 is not properly connected to the female connector 100. Of course, in another example, the computing device may also receive a signal from sensor 130A to report the state of actuator 115B even if sensor 130B indicates that actuator 115B is in the uncompressed state. For example, sensor 130B may have malfunctioned or the actuator 115B may have broken. If so, once the sensor 130A indicates that actuator 115A is in the compressed state but sensor 130B reports actuator 115B is in the uncompressed state, the computing device can determine sensor 130B (or actuator 115B) has malfunctioned.

Figure 5B:
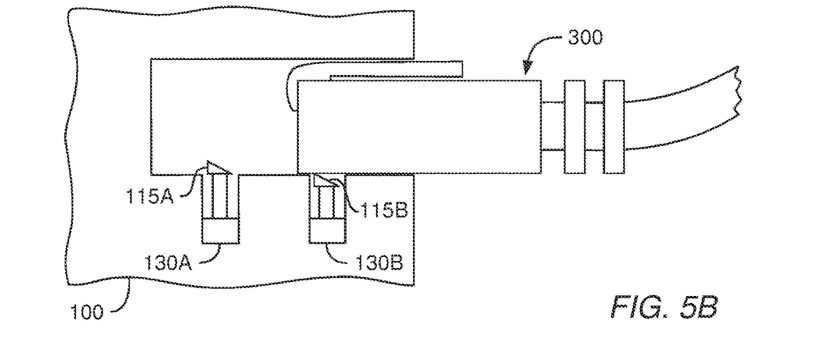

FIG. 5B illustrates that the user has inserted male connector 300 into the aperture 110 such that the bottom surface of the male connector 300 has pressed down actuator 115B, while actuator 115A remains uncompressed. As such, sensor 130B informs the computing device that actuator 115B is in the compressed state, and thus, the outermost actuator has been activated. Thus, the query at block 405 would be answered in the affirmative and method 400 proceeds to block 415 where the computing device determines if the innermost actuator is activated. Because in FIG. 5B the innermost actuator 115A is in the uncompressed state (e.g., is deactivated), method 400 proceeds to block 410 where the computing device determines that the connection between the male and female connectors is improper. For example, the user may believe that male and female connectors are fully engaged, but in reality, the male connector 300 is only partially inserted into aperture 110.

As will be discussed in more detail below, the computing device may provide different instructions to the user depending on whether actuator 115B is deactivated or actuator 115B is activated but actuator 115A is deactivated. For example, if the outermost actuator 115B is not activated, the computing device may instruct the user to identify and plug in the male connector 300. However, if the outermost actuator 115B is activated but the innermost actuator 115A remains deactivated, the computing device informs the user the connection is only partial and the user should push the male connector 300 further into aperture 110.

Figure 5C:
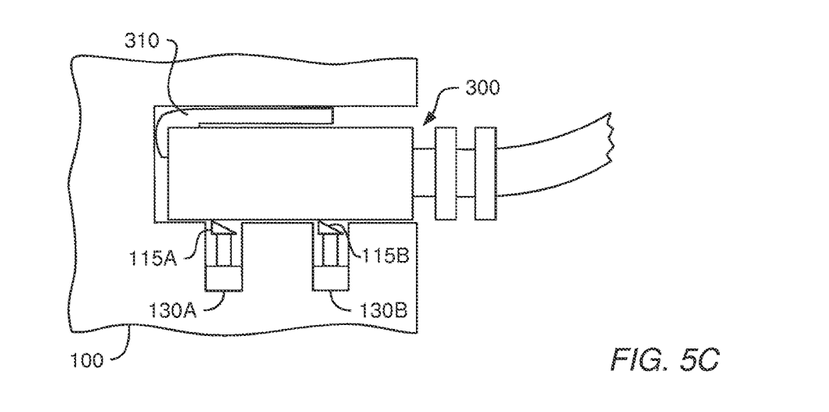

In FIG. 5C, the male and female connectors are fully engaged, and as such, both actuators 115A and 115B are in the compressed state. In one example, the innermost actuator 115A is arranged in the female connector 100 such that actuator 115A is pressed down by male connector 300 only when the latching mechanism 310 engages a locking feature in the female connector 100, thereby ensure the connection is secure. Alternatively or additionally, the actuator 115A is arranged in the female connector 100 such that actuator 115A is pressed down only when the data connectors of the female connector 100 contact the data connectors on the male connector 300. Thus, even if data does not flow between the female and male connectors, the sensor 130A nonetheless informs the computing device that the male connector 300 is fully engaged with the female connector 100.

Returning to block 415, if both actuators 115 are active (e.g., in the compressed state), method 400 proceeds to block 420 where the computing device determines that the connection between the female connector 100 and male connector 300 is correct (i.e., proper). The computing device may make this determination even if data is not flowing between the female and male connectors. For example, the network may be down or unavailable. Nonetheless, by using two actuators that are spaced different distances from the opening of the aperture 110, the computing device can determine if the male connector 300 is properly connected to the female connector 100.

As used herein, determining whether the actuators or sensors are "activated" changes depending on the particular type of actuator or sensor used. For example, the actuators 115 and sensor 130 shown in FIGS. 5A-5C are activated when the male connector 100 compress the springs and force the actuators 115 down. In response, the sensors 130 transmit respective signals to the computing device to indicate that the actuators 115 are in the compressed state. In another example, the actuators 115 may be used to close an electrical circuit. When the actuators 115 are in the uncompressed state, the electrical circuit is open and current does not flow. However, when the actuators 115 are compressed, the electrical circuit is closed and current flows. Thus, by measuring the current (or absence of current), the computing device determines if the actuators 115 or sensors 130 are activated. In another example, instead of mechanical actuation, optical, magnetic, or electrical detection elements may be used. For example, two light sources may be spaced at different distances from the opening in the female connector 100. As the male connector 300 is inserted into the aperture 110, the connector 300 may first break a beam emitted from the outermost light source which indicates that the male connector 300 is partially connected to the female connector 100. When the male connector 300 breaks a beam emitted from the innermost light source, the computing device determines the male connector 300 is fully engaged with the female connector. Although method 400 discusses using mechanical actuators, the embodiments herein may be used with any detection elements (e.g., mechanical actuators, optical detectors, electrical detectors, magnetic detectors, and the like) that are located at different depths within aperture 110.

Figure 6:
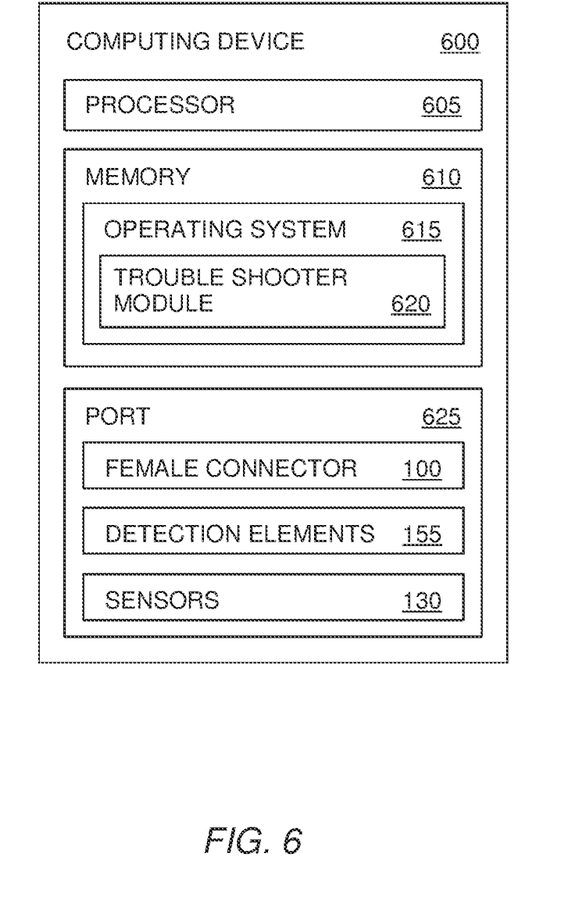
FIG. 6 is a block diagram of a computing device that includes the female connector, according to one embodiment described herein.

FIG. 6 is a block diagram of a computing device 600 that includes the female connector 100, according to one embodiment described herein. The computing device 600 also includes processor 605, memory 610, and port 625. The processor 605 may represent one or more processing elements that each may have one or more processing cores. The memory 610 may include volatile memory, non-volatile memory, or combinations of both—e.g., hard disk drives, RAM, Flash memory, and the like. The memory 610 includes operating system 615 which may be any operating system capable of performing the functions described herein. The operating system 615 includes a troubleshooter module 620 which is communicatively coupled to the sensors 130. Based on the signals provided by sensors 130, the troubleshooter module 620 determines whether the detection elements 155 are activated or deactivated. The troubleshooter module 620 may use this knowledge to provide instructions to the user (either a user proximate to the computing device 600 or a remote user such as a remote IT specialist). For example, the troubleshooter module 620 may inform the user that an Ethernet or HDMI connector should be connected into port 625 in order to enable a certain function of the computing device 600. In one example, the computing system is a point-of-sale (POS) system where port 625 is use to transmit or receive purchase information, payment information, inventor information, and the like from a central server, LAN, or WAN. For example, the port 625 may be an Ethernet port where the female connector 100 is coupled to a male connector (and a corresponding cable) in order to communicate with the central server.

The troubleshooter module 620 can inform the user that there is a problem with the connection between the female connector 100 and a male connector and provide the user with step-by-step instructions for solving the problem. In one example, the troubleshooter module 620 may run a check on port 625 when the operating system 615 boots up. Additionally, the troubleshooter module 620 may continuously, or at intervals, monitor the signals provided by the sensors 130 to ensure the connection between the female and male connectors is maintained.

Figure 7:
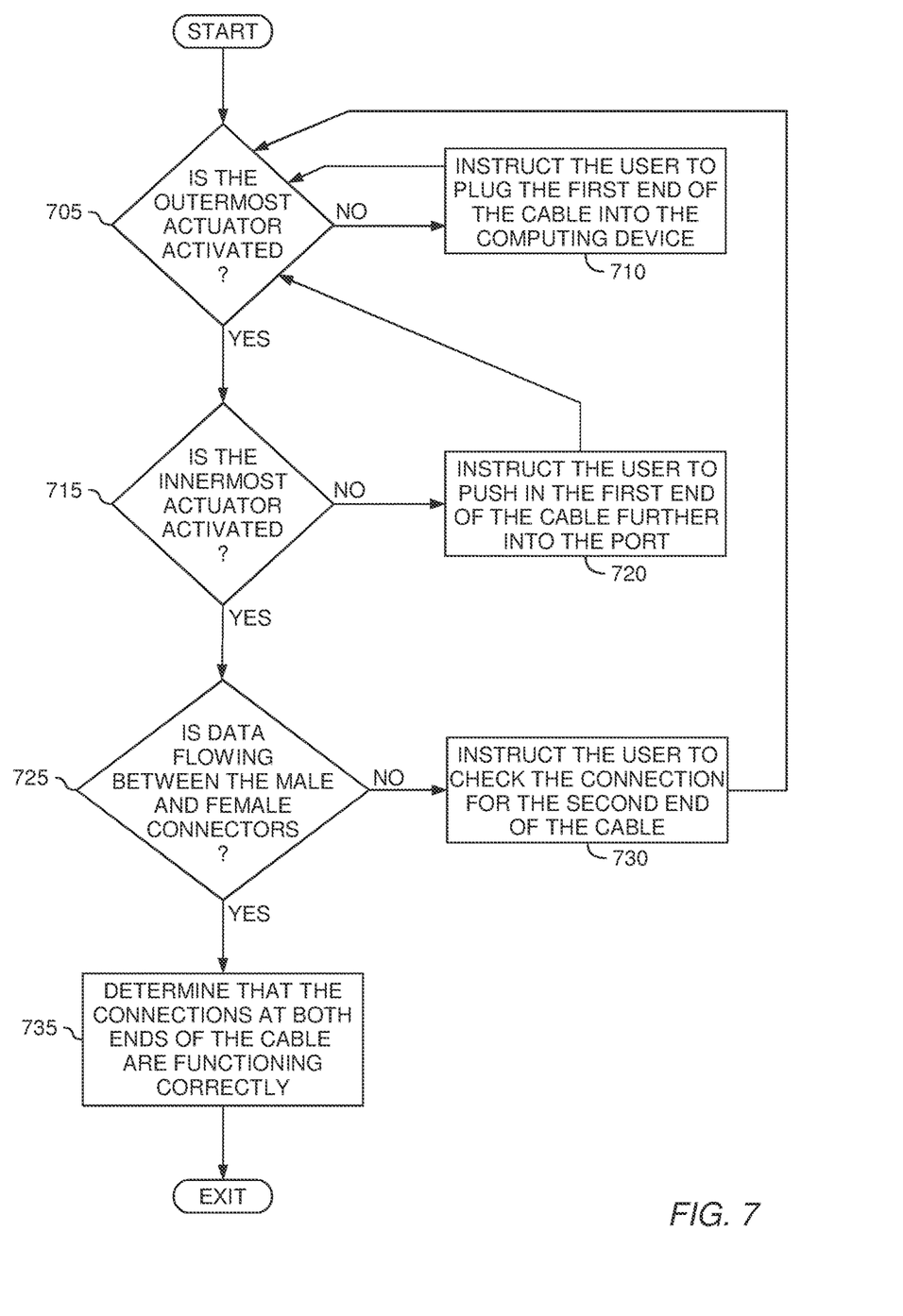
FIG. 7 is a method for detecting proper connection of a cable to the computing device, according to one embodiment described herein.

FIG. 7 is a method 700 for detecting proper connection of a cable to the computing device, according to one embodiment described herein. Method 700 begins at block 715 where the troubleshooter module determines whether the outermost sensor (i.e., the sensor and detection element closest to the opening of the aperture in the female connector) is activated. If not, at block 710, the troubleshooter module instructs the user to plug a first end of a cable into the computing device. Because the outermost sensor is closer to the opening, if this sensor is not activated, the troubleshooter module determines that the corresponding male connector is not inserted into the female connector. Furthermore, even if the male connector was previously inserted, the fact the outermost sensor is now deactivated means the cable has fallen out (assuming the outmost sensor is functioning properly).

In one example, the troubleshooter module may determine what type of cable the user should plug in—e.g., Ethernet, HDMI, USB, etc. The troubleshooter module may then display an image of the cable and the male connector using a display device coupled to the computing device to aid the user in identifying the correct cable. Thus, even if troubleshooter module monitors multiple ports that use different data transfer protocols (e.g., HDMI versus DVI), the troubleshooter module can customize its feedback to the user in order to guide the user through the troubleshooting process.

When the troubleshooter module determines that the outermost sensor is activated, at block 715, the module determines whether the innermost sensor is activated. If not, at block 720, the troubleshooter module instructs the user to push the first end of the cable further into the port. Stated differently, if the outermost sensor but not the innermost sensor has been activated, the troubleshooter module determines the male connector is only partially plugged into the male connector. To the view of the user the male connector may appear fully engaged, however, the innermost sensor informs the troubleshooter module that the connection is not fully engaged. In one example, when the inner sensor is deactivated, the troubleshooter module determines that the data connectors in the female connector and the male connectors are not contacting, and thus, data cannot flow between the connectors. In response, the troubleshooter module informs the user of the partial connection. Additionally, if the male connector includes a latching mechanism, the troubleshooter module may instruct the user to push in the male connector until the user hears a click corresponding to the latching mechanism engaging a locking feature in the female connector or to push in the first end until the user cannot pull the male connector back out of the port.

In one example, the troubleshooter module provides real-time feedback to the user when the user performs the instructions provided at blocks 710 and 720. For example, when the troubleshooter module determines that both the outermost and innermost sensors are activated, the module informs the user that the male and female connectors are properly connected. Thus, the user can have almost instantaneous audio or visual feedback that she correctly performed the instructions. Moreover, if the troubleshooter module monitors multiple ports and the user plugs the cable into the wrong port, the sensors in the wrong port inform the troubleshooter module which, in response, provides updated instructions to the user to help the user indentify the correct port.

If both the outermost and innermost sensors are activated, the method proceeds to block 725 where the troubleshoot module determines whether data is flowing between the male and female connectors. In one example, a status signal (e.g., a LAN active signal in the case of Ethernet communication) is active if data is flowing between the male and female connectors—i.e., the computing devices connected by the cable are operating. For example, the cable may be used to connect the computing device to a network device (e.g., central server, router, or switch). If the network device is not currently operating, the status signal may be deactivated. However, because the troubleshooter module knows that the connection between the female connector on the computing device and the male connector on the cable is proper, the troubleshooter module can eliminate this connection as the source of the problem. Instead, at block 730, the troubleshooter module instructs the user to check the connection for the second end of the cable. For example, the user may have forgotten to plug the second end of the cable into a wall socket that connects the computing device to a LAN or the central server. If the second end of the cable is properly connected, the troubleshooter module may instruct the user to check the network device to ensure it is powered on and operating properly. In this manner, the sensors and status signal may be used to identify and eliminate sources of problems associated with plugging cables into ports.

If the sensors are activated and the status signal indicates data is flowing, at block 735 the troubleshooter module determines that the connections at both ends of the cable are functioning correctly. Thus, if the user encounters any problems, the troubleshooter module is able to eliminate the connection between the female and male connectors as a source of the problem.

In one example, the troubleshooter module may transmit information regarding the sensors and the status signal to a remote IT representative. For example, the computing device may have a separate wired or wireless connection to the Internet which permits the troubleshooter module to communicate with the IT representative. Thus, when a user of the computing device calls the IT representative, the representative can already determine whether the ports monitored by the troubleshooter module are correctly coupled to the cables using the information provided by the troubleshooter module. If the cable is not properly connected, the IT representative can quickly indentify the problem and provide the user with instructions to resolve the issue. Thus, the troubleshooter module may be used to reduce the number of calls to IT representatives by providing local instructions when an improper connection is detected or reduce the time needed for an IT representative to diagnose the problem and provide the user with instructions. Moreover, in another example, the IT representative may receive the information from the troubleshooter module and preemptively call the local user when an improper connection is detected even before the user has noticed any problems. For example, the user may have kicked loose a cable while a POS device was not being used. After being informed of the loose cable by the troubleshooter module, the IT representative can either fix the problem (if nearby) or instruct a local user to reinsert the cable.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the described aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A female connector, comprising:
   an inner surface defining an aperture and an opening at a first end of the aperture, the opening and the aperture configured to receive a male connector;
   at least one data connector element arranged on the inner surface to contact a respective data connector element on the male connector;
   a first detector comprising a first actuator disposed on the inner surface, the first actuator is spaced a first distance from the opening along a first direction, wherein, when inserted into the opening, the male connector moves the first actuator from a first position to a second position; and
   a second detector comprising a second actuator disposed at the inner surface, the second actuator is spaced a second distance from the opening along the first direction, wherein the second distance is greater than the first distance, and wherein, when inserted into the opening, the male connector moves the second actuator from a third position to a fourth position.

2. The female connector of claim 1, further comprising:
   a first sensor coupled to the first actuator, the first sensor is configured to change states when the male connector moves the first actuator; and
   a second sensor coupled to the second actuator, the second sensor is configured to change states when the male connector moves the second actuator.

3. The female connector of claim 2, wherein the first sensor is configured to output a first indication when the first actuator is not proximate to the male connector and a second, different indication when the first actuator is proximate to the male connector, and wherein the second sensor is configured to output the first indication when the second actuator is not proximate to the male connector and the second indication when the second actuator is proximate to the male connector.

4. The female connector of claim 1, further comprising:
   a first spring mechanically coupled to the first actuator, the first spring is compressed relative to a first default state when the first actuator moves from the first position to the second position; and
   a second spring mechanically coupled to the second actuator, the second spring is compressed relative to a second default state when the second actuator moves from the third position to the fourth position.

5. The female connector of claim 1, wherein the second actuator is disposed on the inner surface such that the second actuator is moved by the male connector only when the at least one data connector element contacts the respective data connector element on the male connector.

6. The female connector of claim 5, wherein the at least one data connector element is disposed on a back surface of the inner surface that is opposite of the opening.

7. The female connector of claim 1, wherein the inner surface is configured to couple to a RJ-45 connector.

8. The female connector of claim 1, wherein the female and male connectors are compatible with a data transfer protocol.

9. The female connector of claim 1, wherein the at least one data connector element in the female connector contacts the respective data connector element on the male connector only when the male connector has changed both a characteristic of the first actuator and a characteristic of the second actuator.

10. A method, comprising:
    determining whether a first detector is activated by a male connector disposed on a first end of a cable, wherein the first detector is disposed on an inner surface of a female connector and is spaced a first distance from an opening defined by the inner surface for receiving the male connector;
    determining whether a second detector is activated by the male connector, wherein the second detector is disposed on the inner surface and is spaced a second distance from the opening, wherein the second distance is further from the opening than the first distance relative to a direction perpendicular to the opening;
    upon determining the first detector is activated and the second detector is not activated, outputting a first troubleshooting instruction for a user; and upon determining that the first and second detectors are both not activated, outputting a second, different troubleshooting instruction for the user.

11. The method of claim 10, further comprising:

upon determining the first detector is activated and the second detector is not activated, determining that the male connector is partially connected to the female connector; and upon determining the first and second detectors are activated, determining that the male connector is fully engaged to the female connector.

12. The method of claim 10, further comprising:

determining whether a status signal is active, wherein the status signal indicates data is flowing between the female and male connectors; and upon determining the status signal is not active and the first and second detectors are activated, outputting a third troubleshooting instruction for the user different from the first and second troubleshooting instructions.

13. The method of claim 12, further comprising, upon determining the status signal is active and the first and second detectors are activated, determining that (i) a connection between the male and female connectors is proper and (ii) a second end of the cable is properly connected to a different female connector.

14. The method of claim 10, wherein the second detector is disposed on the inner surface such that the second detector is activated by the male connector only when a plurality of data connectors disposed on the inner surface contact respective data connectors on the male connector.

15. The method of claim 10, further comprising, upon determining the first and second detectors are both activated by the male connector, determining that the male connecter and the female connector are fully engaged such that a data connector disposed on the female connector contacts a data connector disposed on the male connector.

16. A computer program product for checking a connection between a female and male connector, the computer program product comprising:

a non-transitory computer-readable storage medium having computer-readable program code embodied therewith, the computer-readable program code executable by one or more computer processors to:

determine whether a first detector is activated by the male connector disposed on a first end of a cable, wherein the first detector is disposed on an inner surface of the female connector and is spaced a first distance from an opening defined by the inner surface for receiving the male connector;

determine whether a second detector is activated by the male connector, wherein the second detector is disposed on the inner surface and is spaced a second distance from the opening, wherein the second distance is further from the opening than the first distance relative to a direction perpendicular to the opening;

upon determining the first detector is activated and the second detector is not activated, output a first troubleshooting instruction for a user; and upon determining that the first and second detectors are both not activated, output a second, different troubleshooting instruction for the user.

17. The computer program product of claim 16, wherein the computer-readable program code is further executable to:

upon determining the first detector is activated and the second detector is not activated, determine that the male connector is partially connected to the female connector; and upon determining the first and second detectors are activated, determine that the male connector is fully engaged to the female connector.

18. The computer program product of claim 16, wherein the computer-readable program code is further executable to:

determine whether a status signal is active, wherein the status signal indicates data is flowing between the female and male connectors; and upon determining the status signal is not active and the first and second detectors are activated, output a third troubleshooting instruction for the user different from the first and second troubleshooting instructions.

19. The computer program product of claim 18, wherein the computer-readable program code is further executable to:

upon determining the status signal is active and the first and second detectors are activated, determine that (i) a connection between the male and female connectors is proper and (ii) a second end of the cable is properly connected to a different female connector.

20. The computer program product of claim 16, wherein the second detector is disposed on the inner surface such that the second detector is activated by the male connector only when a plurality of data connectors disposed on the inner surface contact respective data connectors on the male connector.

* * * * *